(12) United States Patent
Dujari et al.

(10) Patent No.: US 6,627,978 B2
(45) Date of Patent: Sep. 30, 2003

(54) CHIP PACKAGE ENABLING INCREASED INPUT/OUTPUT DENSITY

(75) Inventors: Prateek Dujari, Portland, OR (US); Franklin Monzon, Temple City, CA (US); Pooya Tadayon, Hillsboro, OR (US)

(73) Assignee: Intel Corporation, Hillsboro, OR (US)

( * ) Notice: Subject to any disclaimer, the term of this patent is extended or adjusted under 35 U.S.C. 154(b) by 0 days.

(21) Appl. No.: 09/967,748

(22) Filed: Sep. 28, 2001

(65) Prior Publication Data

US 2003/0064584 A1 Apr. 3, 2003

(51) Int. Cl.[7] .................................. H01L 23/495
(52) U.S. Cl. .................. 257/667; 257/672; 257/675; 257/706
(58) Field of Search ............... 257/667, 706, 257/672, 675

(56) References Cited

U.S. PATENT DOCUMENTS

| | | | | |
|---|---|---|---|---|
| 5,396,403 A | * | 3/1995 | Patel .................... | 361/705 |
| 5,432,675 A | * | 7/1995 | Sorimachi et al. ...... | 361/719 |
| 5,682,062 A | * | 10/1997 | Gaul ..................... | 257/686 |
| 5,737,192 A | * | 4/1998 | Linderman ............. | 361/790 |
| 5,744,863 A | * | 4/1998 | Culnane et al. ........ | 257/712 |
| 5,838,060 A | * | 11/1998 | Comer .................. | 257/685 |
| 6,081,027 A | * | 6/2000 | Akram ................... | 257/707 |
| 6,251,707 B1 | * | 6/2001 | Bernier et al. ........ | 438/122 |
| 6,444,576 B1 | * | 9/2002 | Kong ..................... | 438/667 |
| 6,451,709 B1 | * | 9/2002 | Hembree ............... | 438/759 |

* cited by examiner

Primary Examiner—Richard Elms
Assistant Examiner—Doug Menz
(74) Attorney, Agent, or Firm—Kenyon & Kenyon

(57) ABSTRACT

A device and method for increasing input/output from a die by making electrically conductive microvias connecting the integrated circuit with a backside of the die. The backside electrically conductive microvias connect an integrated circuit in the die to pads on the backside of the die. A superstrate is situated on top of the die and connects to the microvias using controlled collapse chip connections (C4) with a thermal interface material (TIM) surrounding the electrical connections. A superstrate lead system electrically connects the backside pads to wirebonds that connect with either the substrate or directly to the motherboard. Heat dissipates from the die via the TIM to the superstrate to a heat sink situated on top of the superstate.

19 Claims, 1 Drawing Sheet

CHIP PACKAGE ENABLING INCREASED INPUT/OUTPUT DENSITY

FIELD OF THE INVENTION

The present invention relates to an integrated chip package. More specifically, the present invention relates to an integrated chip package that increases input/output for a chip by using electrically conductive microvias on a backside of a die to connect to a superstrate.

BACKGROUND INFORMATION

Integrated circuits are installed in various types of packages in order to provide: external electrical connections for the transistors of the integrated circuit via a lead system; physical and environmental protection for the chip; and heat dissipation from the transistor. Rapid advances in integrated circuit technology have created pressure to push the limits on packaging technology. The number of transistors on a die (wafer) has been increasing exponentially for many years, and the size of these transistors has been decreasing dramatically as well. The problem arises of increasing the input/output from the integrated circuit in the die to a motherboard or other external hardware.

While designers can put millions of transistors on a die, they are greatly constrained by the limited input/output density that today's packaging technology can accommodate. There are limits to extending the envelope in some packaging attributes such as interconnect pitch (i.e., the distance between connections, e.g., the distance between solder bumps), materials, etc., from a reliability and manufacturing point of view. For example, the smallest interconnect pitch and dimensions available today are state of the art, and anything smaller to increase input/output density is either not reliable or poses significant manufacturing problems.

One method for increasing input/output from a chip that has been pursued in industry is the use of three-dimensional stacked die technology. However, this solution is primarily intended for low-heat dissipating devices such as Flash, SRAM, etc., since the package structure often does not allow for an adequate heat dissipation device (e.g., a heat sink). Such solutions are therefore inappropriate for microprocessors and various chipsets. Designers for microprocessors and various chipsets are forced to constrain input/output count at the cost of desired beneficial features in the chip.

Vias connecting the integrated circuit to a frontside of the wafer are constructed by etching, layering, masking, and other photo-lithographic techniques. However, the density of these frontside connections, or pads, is limited. The pitch, the distance between adjacent pads, is limited by current bonding technology, and therefore input/output from a frontside of the wafer is limited. Conductive micovias are sometimes used in substrates to make electrical connections to the die. These microvias connect the integrated circuit to an external connection which connects to a motherboard. This external connection may be by a ball grate array, a pin grid array, or any other method of electrical coupling available.

There is a need for increased input/output density with good heat dissipation for use with microprocessors, chipsets, etc. (e.g., any processor requiring high input/output count and good heat dissipation).

DETAILED DESCRIPTION

Figure 1:
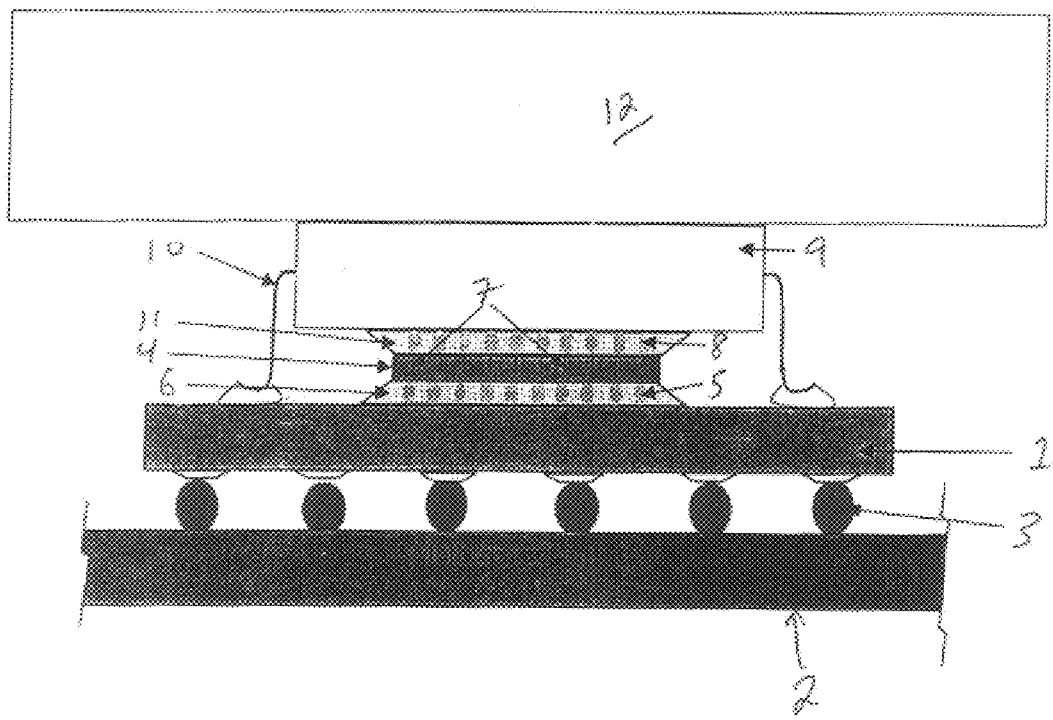
FIG. 1 is a schematic representation of a side view of an example embodiment of the present invention.

A new integrated chip package is proposed that increases input/output density through die backside connections that connect to the integrated circuit by electrically conductive microvias. The proposed integrated chip package dissipates heat with a ceramic superstrate situated on the top of the die and in contact with a heat sink.

The invention is illustrated schematically in FIG. 1. A substrate (1) is situated on a motherboard (2). The substrate (1) is electrically coupled to the motherboard (2) by a ball grate array (3), a pin grid array (not shown), or any other method for electrically coupling two components. A die (4) is situated on top of the substrate (1). The die (4) shown is oriented as a flip-chip, although alternatively it may be normally oriented. The die (4) has frontside pads (not shown) on the side facing the substrate (1). The frontside pads connect by frontside C4 (controlled collapse chip connection) bumps (5) to the lead system (not shown) of the substrate (1). Alternatively, any other method of providing electrical connections from the die (4) to the substrate (1) may be employed. Surrounding C4 bumps (5) and supporting die (4) on substrate (1) is an underfill material (6). The underfill material (6) may be of any appropriate material and may provide mechanical support for the chip as well as heat dissipation The die (4) has microvias (7) etched or drilled to provide electrical coupling to backside pads (not shown) of the die (4). The backside pads are metallized in the same manner as conventional frontside pads. A superstrate (9) is electrically coupled to the top of the die (4) using C4 technology, or any other appropriate means. Specifically, C4 bumps on the backside pads are joined with C4 bumps on the superstrate (9) to create the electrical connections in the form of backside C4 bumps (8). The frontside C4 bumps (5) connecting the die (4) to the substrate (1), and the backside C4 bumps (8) connecting the die (4) to the superstrate (9), are bonded by situating the C4 bumps adjacent to each other and increasing the temperature to around 190 degrees Celsius. As noted above, alternatively the chip may be normally oriented, with the frontside of the die (4), or chip, connected to the superstrate (9), and the backside of the die (4) connected to the substrate (1). The superstrate (9) may be made of ceramic, an epoxy, or any other appropriate material.

The backside connections to the die (4) may enable routing additional inputs/outputs from the die (4) to the superstrate (9). The superstrate (9) may act in a similar fashion to a conventional substrate, and may include traces (not shown), vias (not shown), and layers (not shown). These various features are variable and may be selected as appropriate by the designer. The superstrate (9) may be electrically coupled to the substrate (1) using a peripheral array of wirebonds (10), or alternatively Surface Mount Technology leads. Since thicker wirebonds (10) may be accommodated, the designer may have additional flexibility in selecting the optimum wire dimensions. All electrical connections from the die (4) may thus be available at the substrate (1) and may be routed from here by conventional means. Alternatively, these wirebonds (10) may be connected directly from the superstrate (9) to the motherboard (2). Another alternative involves direct board attachment, in which the substrate does not exist in the package, and all connections from the die frontside and backside may be made available at the motherboard (2) to be routed by conventional means. In this alternative, the frontside connections to the motherboard (2) may be by frontside C4 bumps (5), whereas the backside pads connect, as in the primary embodiment, may be through a superstrate (9) to wirebonds (10). In a variation of this alternative, the wirebonds (10) may connect directly to the motherboard (2).

An advantage of this structure may be higher input/output count. This higher input/output count may be possible due to the increased surface area (backside along with frontside) available through which to route input/output. Input/output is limited, as noted above, by interconnect pitch (i.e., the distance between connections), and therefore a larger area in which to make connections may enable a greater number of connections.

For high heat dissipating chips such as microprocessors and multiple chipsets, thermal interface material (11) (TIM), or thermally conductive epoxy, is dispensed between the superstrate (9) and the die (4) in the same manner as conventional underfill material. This TIM (11) forms a thermal contact between the die (4) and the thermally conductive (e.g., ceramic) superstrate (9). A heat sink (12) can then be installed on top of the superstrate (9) using a conventional TIM (not shown). An advantage of this configuration may be good heat dissipation.

What is claimed is:

1. A device comprising:
    a die, the die including at least one backside electrically conductive microvia, wherein the at least one backside electrically conductive microvia is electrically coupled to an integrated circuit in the die, extends from the integrated circuit to a backside of the die, and provides input/output to a motherboard; and
    a superstrate, the die mounted with the backside in contact with a bottomside of the superstrate, the superstrate having at least one superstrate inner lead on the bottomside, the at least one superstrate inner lead situated adjacent to and electrically coupled to at least one backside pad;
    wherein the at least one backside pad is situated on the backside of the die and is electrically coupled to the at least one backside electrically conductive microvia; and
    wherein at least one frontside pad is situated on a frontside of the die and is electrically coupled to the integrated circuit.

2. The device of claim 1, wherein:
    the at least one backside pad is electrically coupled to the at least one superstrate inner lead by a controlled collapse chip connection material; and
    the at least one backside pad and the at least one superstrate inner lead are supported by a thermal interface material.

3. The device of claim 1, wherein the superstrate is constructed of at least one of a ceramic and an epoxy material.

4. The device of claim 1, wherein the superstrate is embedded with a lead frame, the lead frame electrically coupling the at least one superstrate inner lead and at least one superstrate outer lead.

5. The device of claim 4, wherein the at least one superstrate outer lead electrically couples via a wirebond to at least one of the motherboard and a substrate.

6. The device of claim 1, wherein a heat sink is situated on a topside of the superstrate, the topside opposite the bottomside.

7. The device of claim 1, wherein the at least one backside electrically conductive microvia comprises a conductive polymer.

8. A method comprising:
    providing at least one backside electrically conductive microvia to a die, wherein the at least one backside electrically conductive microvia extends from an integrated circuit near a frontside of the die to at least one backside pad on a backside of the die, the backside opposite the frontside, and wherein the at least one backside pad provides input/output to a motherboard; and
    providing a superstrate in contact with the die, a bottomside of the superstrate situated adjacent to the backside of the die.

9. The method of claim 8, wherein the superstrate is embedded with a lead frame, the lead frame electrically coupling at least one superstrate inner lead and at least one superstrate outer lead.

10. The method of claim 8, wherein:
    the at least one backside pad is electrically coupled to the motherboard via at least one superstrate inner lead by a controlled collapse chip connection material; and
    the at least one backside pad and the at least one superstrate inner lead are supported by a thermal interface material.

11. The method of claim 8, wherein the at least one superstrate outer lead electrically couples via a wirebond to at least one of the motherboard and a substrate.

12. The method of claim 8, further comprising:
    providing a heat sink situated on a topside of the superstrate, the topside opposite the bottomside.

13. The method of claim 8, wherein the at least one backside electrically conductive microvia comprises a conductive polymer.

14. An integrated circuit package comprising:
    a substrate, a chipside of the substrate situated adjacent to a frontside of a wafer, the substrate having at least one substrate inner lead, the at least one substrate inner lead electrically coupled to an integrated circuit in the wafer; and
    a superstrate, a bottomside of the superstrate situated on a backside of the wafer, the backside opposite the frontside, the superstrate having at least one superstrate inner lead, the at least one superstrate inner lead electrically coupled to the integrated circuit in the wafer by at least one backside electrically conductive microvia.

15. The integrated circuit package of claim 14, further comprising a heat sink, the heat sink situated on a topside of the superstrate, the topside opposite the bottomside.

16. The integrated circuit package of claim 14, wherein the superstrate is constructed of at least one of a ceramic and an epoxy material.

17. The integrated circuit package of claim 14, wherein the superstrate is embedded with a lead frame, the lead frame electrically coupling the at least one superstrate inner lead and at least one superstrate outer lead.

18. The integrated circuit package of claim 14, wherein the at least one superstrate outer lead electrically couples via a wirebond to at least one of a motherboard and a substrate.

19. The integrated circuit package of claim 14, wherein the at least one backside electrically conductive microvia comprises a conductive polymer.

* * * * *